(12) United States Patent
Ozeki et al.

(10) Patent No.: US 11,164,991 B2
(45) Date of Patent: Nov. 2, 2021

(54) LIGHT EMITTING DEVICE AND METHOD FOR MANUFACTURING LIGHT EMITTING DEVICE

(71) Applicant: NICHIA CORPORATION, Anan (JP)

(72) Inventors: Kenji Ozeki, Tokushima (JP); Atsushi Kojima, Tokushima (JP); Chinami Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 11 days.

(21) Appl. No.: 16/724,007

(22) Filed: Dec. 20, 2019

(65) Prior Publication Data

US 2020/0212015 A1 Jul. 2, 2020

(30) Foreign Application Priority Data

Dec. 27, 2018 (JP) .............................. JP2018-245101

(51) Int. Cl.
| | |
|---|---|
| *H01L 33/00* | (2010.01) |
| *H01L 25/075* | (2006.01) |
| *H01L 33/50* | (2010.01) |
| *H01L 33/58* | (2010.01) |
| *H01L 33/52* | (2010.01) |
| *H01L 21/77* | (2017.01) |

(52) U.S. Cl.
CPC ............ *H01L 33/005* (2013.01); *H01L 21/77* (2013.01); *H01L 25/0753* (2013.01); *H01L 33/505* (2013.01); *H01L 33/507* (2013.01); *H01L 33/52* (2013.01); *H01L 33/58* (2013.01); *H01L 2933/0041* (2013.01); *H01L 2933/0058* (2013.01)

(58) Field of Classification Search
CPC ... H01L 25/0753; H01L 33/58; H01L 33/505; H01L 33/507; H01L 33/60; H01L 2933/0041; H01L 2933/0058; H01L 33/52; H01L 33/005; H01L 21/77
See application file for complete search history.

(56) References Cited

U.S. PATENT DOCUMENTS

| | | | |
|---|---|---|---|
| 2002/0123164 A1* | 9/2002 | Slater, Jr. | ............... H01L 33/405 438/39 |
| 2009/0166657 A1 | 7/2009 | Yamada et al. | |
| 2012/0007112 A1 | 1/2012 | Yamada et al. | |

(Continued)

FOREIGN PATENT DOCUMENTS

| | | |
|---|---|---|
| JP | 2009-182307 A | 8/2009 |
| JP | 2015-079805 A | 4/2015 |

(Continued)

*Primary Examiner* — Feifei Yeung Lopez
(74) *Attorney, Agent, or Firm* — Foley & Lardner LLP

(57) ABSTRACT

A light emitting device includes: a plurality of light emitting elements; a plurality of light transmissive members, each located on an upper surface of a respective one of the light emitting element; a mounting board on which the light emitting elements are disposed; a first cover member located on or above the mounting board, the first cover member comprising: a first reflective material containing layer disposed between the light emitting elements and containing a first reflective material, and a light transmissive layer disposed between the light transmissive members; and a second cover member disposed around the light emitting elements and comprising a second reflective material.

14 Claims, 8 Drawing Sheets

(56) References Cited

U.S. PATENT DOCUMENTS

| | | | |
|---|---|---|---|
| 2013/0096249 A1* | 4/2013 | Kawabata | C08G 77/20 524/547 |
| 2015/0102366 A1 | 4/2015 | Wada | |
| 2015/0179891 A1 | 6/2015 | Yamada et al. | |
| 2015/0263247 A1 | 9/2015 | Wada et al. | |
| 2015/0263254 A1 | 9/2015 | Miyoshi et al. | |
| 2016/0148912 A1 | 5/2016 | Higashino | |
| 2016/0380165 A1 | 12/2016 | Miyoshi et al. | |
| 2017/0040301 A1* | 2/2017 | Yamamoto | H01L 25/0753 |
| 2017/0062681 A1 | 3/2017 | Miyoshi et al. | |
| 2017/0154880 A1 | 6/2017 | Ozeki et al. | |
| 2017/0301839 A1 | 10/2017 | Miyoshi et al. | |
| 2018/0033926 A1 | 2/2018 | Nonogawa | |
| 2018/0040776 A1 | 2/2018 | Yamada et al. | |
| 2018/0123005 A1* | 5/2018 | Ozeki | H01L 33/54 |
| 2018/0233638 A1 | 8/2018 | Miyoshi et al. | |
| 2018/0252372 A1 | 9/2018 | Noguchi et al. | |
| 2018/0372291 A1 | 12/2018 | Wada et al. | |

FOREIGN PATENT DOCUMENTS

| | | |
|---|---|---|
| JP | 2015-177120 A | 10/2015 |
| JP | 2015-188069 A | 10/2015 |
| JP | 2016-100457 A | 5/2016 |
| JP | 2017-050359 A | 3/2017 |
| JP | 2017-108092 A | 6/2017 |
| JP | 2018-019032 A | 2/2018 |
| JP | 2019-009223 A | 1/2019 |
| JP | 2019-009406 A | 1/2019 |

\* cited by examiner

LIGHT EMITTING DEVICE AND METHOD FOR MANUFACTURING LIGHT EMITTING DEVICE

CROSS-REFERENCE TO RELATED APPLICATION

This application claims priority to Japanese Patent Application No. 2018-245101, filed on Dec. 27, 2018, the entire contents of which are incorporated herein by reference.

BACKGROUND

The present disclosure relates to a light emitting device and a method for manufacturing a light emitting device.

Known in the art is light emitting device that includes a plurality of light emitting elements mounted on or above a mounting board. For example, Japanese Patent Publication No. 2015-177120 discloses a light emitting device in which each of a plurality of light emitting elements is provided with a phosphor plate and in which a reflective material is disposed between the phosphor plates. Japanese Patent Publication No. 2017-108092 discloses a light emitting device in which each of a plurality of light emitting elements is provided with a light transmissive member and in which a cover member is disposed between the light transmissive members.

SUMMARY

The luminous efficacy in the technologies of the above-described publications is capable of further improvement.

An object of certain embodiments of the present disclosure is to provide a light emitting device with a high luminous efficacy and a method for manufacturing such a light emitting device.

A light emitting device according to an embodiment of the present disclosure includes a plurality of light emitting elements, plurality of light transmissive members, a mounting board on which the light emitting elements are disposed, a first cover member, and a second cover member. The light transmissive member are each located on an upper surface of a respective one of the light emitting element. The first cover member is located on or above the mounting board. The first cover member comprises a first reflective material containing layer disposed between the light emitting elements and containing a first reflective material. The first cover member further comprises a light transmissive layer disposed between the light transmissive members. The second cover member is disposed around the light emitting elements and contains a second reflective material.

A method for manufacturing a light emitting device according to an embodiment of the present disclosure includes providing a plurality of light emitting elements, each having an upper surface on which a light transmissive member is disposed; placing the light emitting elements on or above a mounting board with the light transmissive members facing up; and forming a first cover member, which comprises steps of: covering an upper surface of the mounting board with a first resin containing a first reflective material, and settling the first reflective material in the first resin using a centrifugal force so as to form a first reflective material containing layer containing the first reflective material between the light emitting elements, and so as to form a light transmissive layer between the light transmissive members.

A light emitting device according to certain embodiments of the present disclosure has a high luminous efficacy.

A light emitting device with a high luminous efficacy can be manufactured by a method for manufacturing a light emitting device according to certain embodiments of the present disclosure.

DETAILED DESCRIPTION

Figure 1A:
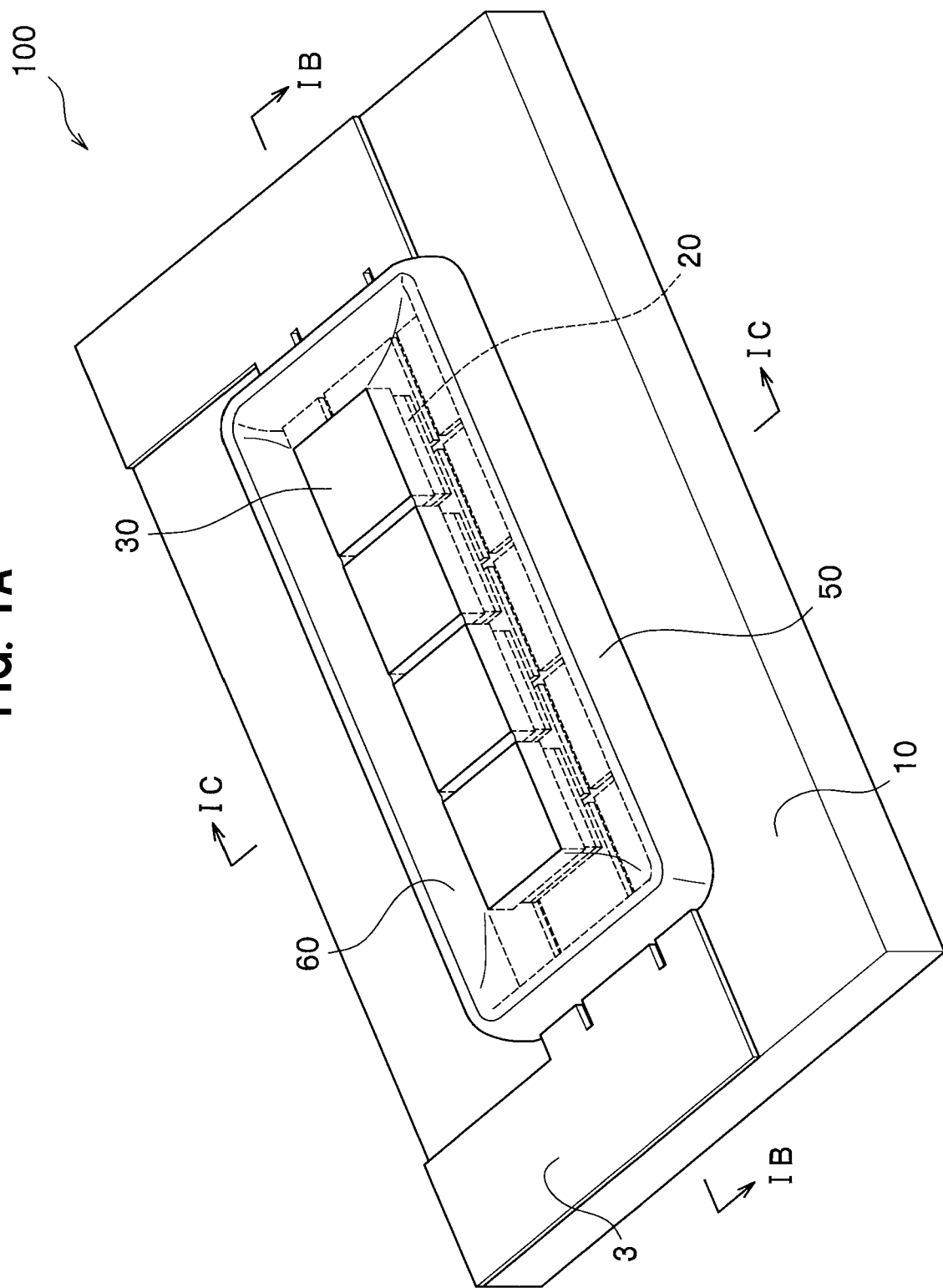
FIG. 1A is a schematic perspective view illustrating the structure of a light emitting device according to an embodiment.

Certain embodiments of the present invention are described below with reference to the drawings. The embodiments described below are examples of a light emitting device and a method for manufacturing a light emitting device according to the technical ideas of the present invention, but the present invention is not limited to the embodiments described below. Unless specifically stated otherwise, the sizes, materials, shapes, and relative positions of constituent components described referring to the embodiments are not intended to limit the scope of the present invention, but are rather merely examples. Magnitudes or positional relationships of members illustrated in the drawings may be exaggerated in order to clarify the descriptions.

Light Emitting Device

Figure 1B:
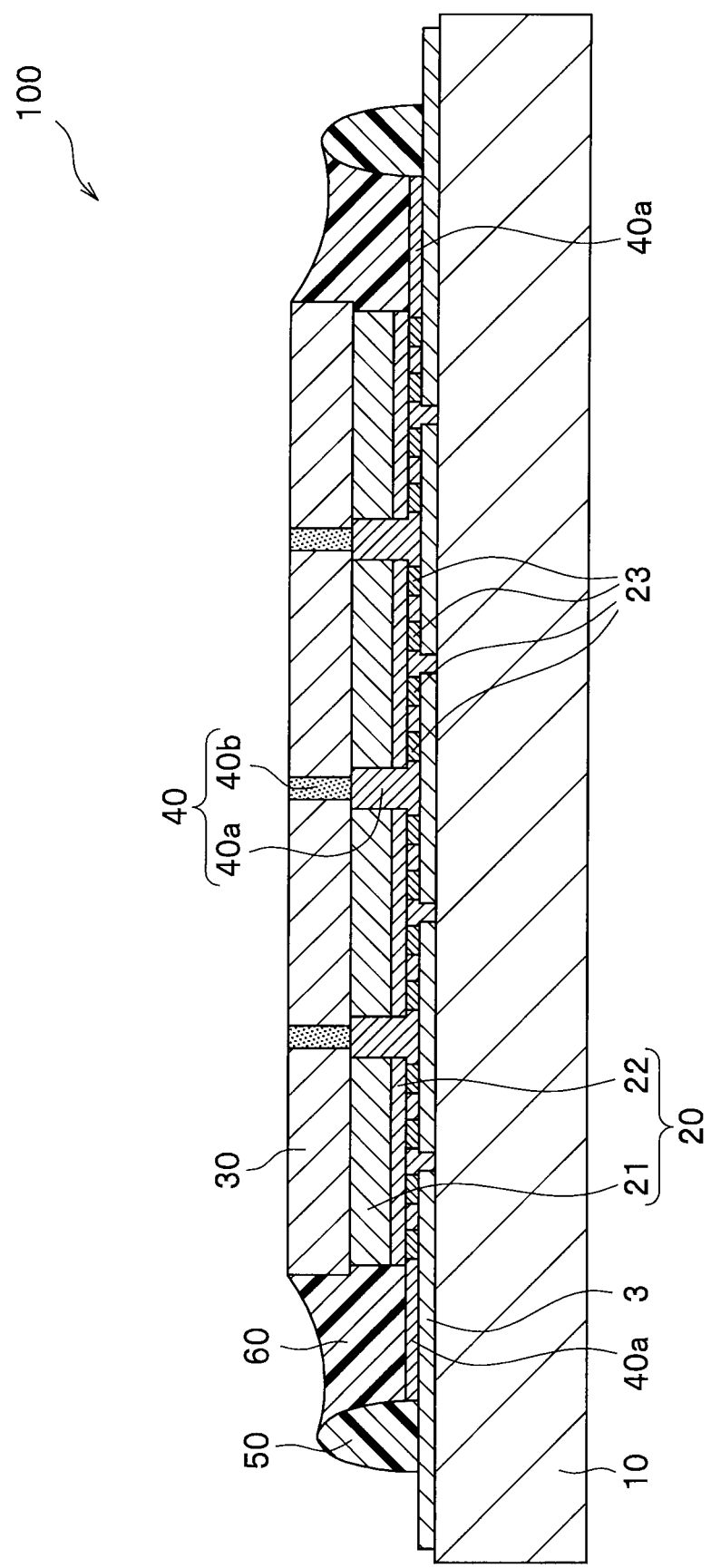
FIG. 1B is a schematic cross-sectional view taken along the line IB-IB of FIG. 1A.
Figure 1C:
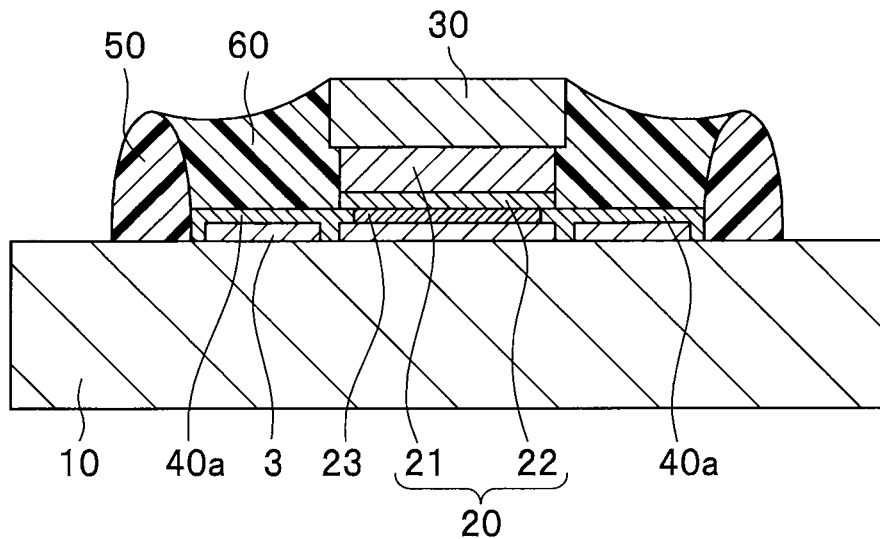
FIG. 1C is a schematic sectional view taken along the line IC-IC of FIG. 1A.

FIG. 1A is a schematic perspective view illustrating the structure of a light emitting device according to an embodiment. FIG. 1B is a schematic cross-sectional view taken along the line IB-IB of FIG. 1A. FIG. 1C is a schematic sectional view taken along the line IC-IC of FIG. 1A.

A light emitting device 100 includes a plurality of light transmissive members 30, a plurality of light emitting elements 20 respectively provided with the light transmissive members 30 on their upper surfaces, a mounting board 10 on which the light emitting elements 20 are disposed, and a first cover member 40 between the light emitting elements 20 and between the light transmissive members 30 on or above the mounting board 10. The first cover member 40 of the light emitting device 100 includes a first reflective material containing layer 40a disposed between the light emitting elements 20 and containing a first reflective material, and a light transmissive layer 40b disposed between the light transmissive members 30.

The light emitting device 100 further includes a second cover member 60 disposed around the light emitting elements 20 and containing a second reflective material.

In other words, the light emitting device 100 mainly includes the mounting board 10, the light emitting elements 20, the light transmissive members 30, the first cover member 40, a frame 50, and the second cover member 60.

The elements of the light emitting device 100 are described below.

The mounting board 10 is a member on or above which the light emitting elements are placed. The mounting board 10 electrically connects the light emitting device 100 to an external device. For example, the mounting board 10 is substantially rectangular in a plan view. The mounting board 10 includes wiring 3.

An insulating material that is unlikely to transmit light emitted from the light emitting elements 20 and extraneous light is preferably used for the mounting board 10. For example, a ceramic such as alumina, aluminum nitride, and mullite, a thermoplastic resin such as polyamides (PA), polyphthalamides (PPA), poly(phenylene sulfide) (PPS), and liquid crystal polymers, or a resin such as epoxy resins, silicone resins, modified epoxy resins, urethane resins, and phenolic resins can be used. The mounting board may have a cavity.

The wiring 3 is disposed on the upper surface of the mounting board 10 and connected to the light emitting elements 20. The wiring 3 is electrically connected to an external power supply.

The wiring 3 can be made of, for example, a metal such as Fe, Cu, Ni, Al, Ag, Au, Al, Pt, Ti, W, and Pd or an alloy containing at least one of these metals. The wiring 3 can be formed by electroplating, electroless plating, vacuum evaporation, sputtering, or the like.

Each of the light emitting elements 20 is a semiconductor element that emits light by itself when voltage is applied. The light emitting element 20 includes a light-transmissive support substrate 21 and a semiconductor layer 22 formed on the support substrate 21. An electrically-conductive substrate or an insulating substrate can be used as the support substrate 21. An appropriate shape, size, and the like of the light emitting element 20 can be selected. The emission color of the light-emitting element 20 can be selected from any appropriate wavelength depending on the purpose. Examples of a blue (i.e., light with wavelengths of 430 nm to 490 nm) or green (i.e., light with wavelengths of 495 nm to 565 nm) light emitting element 20 include a light emitting element including a nitride semiconductor ($In_XAl_YGa_{1-X-Y}N$, where $0 \le X$, $0 \le Y$, and $X+Y \le 1$) or GaP. For a red (i.e., light with wavelengths of 610 nm to 700 nm) light emitting element 20, GaAlAs, AlInGaP, or the like can be used besides a nitride semiconductor element.

The thickness of the light emitting element 20 (such as the height from the lower surface of the semiconductor layer 22 to the upper surface of the support substrate 21) is, for example, in a range of 100 μm to 300 μm.

The light emitting element 20 includes a pair of element electrodes 23 on one surface and is flip-chip mounted on or above the wiring 3 on the mounting board 10.

The light emitting device 100 includes a plurality of light emitting elements 20. In the present embodiment, four light emitting elements 20 are arranged on or above the mounting board 10 in a row. However, the light emitting device may include two, three, or five or more light emitting elements 20. The plurality of light emitting elements 20 may be arranged in a matrix with two or more rows.

The light transmissive members 30 can be made of, for example, resin, glass, or an inorganic substance. The light transmissive members 30 are disposed on the light emitting elements 20. Each of the light transmissive members 30 has a lower surface larger than the upper surface of the light emitting element 20.

The distance between the light transmissive members 30 is preferably in a range of 10 μm to 200 μm. If the distance between the light transmissive members 30 is 10 μm or more, the light emitting elements 20 are easily placed on or above the mounting board 10. On the other hand, if the distance is 200 μm or less, the light transmissive layer 40b easily covers the lateral surfaces of the light transmissive members 30.

The light transmissive members 30 may contain a wavelength conversion material. Examples of the wavelength conversion material include phosphors. Examples of the light transmissive members 30 containing a phosphor include sintered bodies of a phosphor and a mixture of phosphor powder and a substance such as resin, glass, ceramics, and other inorganic substances. Alternatively, the light transmissive members 30 may be molds or compacts of resin, glass, or a ceramic provided with a resin layer containing a phosphor on their surfaces. The light transmissive members 30 may contain a diffusing material, a filler, and the like depending on the purpose.

A substance known in the art can be used as the phosphor. For example, a yellow phosphor such as YAG ($Y_3Al_5O_{12}$:Ce) and silicates, a red phosphor such as CASN ($CaAlSiN_3$:Eu) and KSF ($K_2SiF_6$:Mn), or a green phosphor such as chlorosilicates and $BaSiO_4$:$Eu^{2+}$ can be used.

A substance known in the art can be used as the diffusing material. For example, barium titanate, titanium oxide, aluminum oxide, or silicon oxide can be used.

The first cover member 40 is disposed between the light emitting elements 20 and between the light transmissive members 30 on or above the mounting board 10. The first cover member 40 is made of a first resin containing the first reflective material. The first cover member 40 includes the first reflective material containing layer 40a that is mainly disposed between the light emitting elements 20 and contains the first reflective material, and the light transmissive layer 40b that is mainly disposed between the light transmissive members 30 and does not contain the first reflective material.

The first reflective material containing layer 40a is formed between the light emitting elements 20. The first reflective material containing layer 40a is preferably disposed between the light emitting elements 20 from the upper surface of the mounting board 10 to the height of the upper surfaces of the light emitting elements 20. That is, the first reflective material containing layer 40*a* preferably covers an entirety of each lateral surface of the light emitting elements 20 between the light emitting elements 20. Alternatively, the first reflective material containing layer 40*a* may cover a portion of the each lateral surfaces of the light emitting elements 20 between the light emitting elements 20.

The lateral surfaces of each of the light emitting elements 20 here are portions including the lateral surfaces of the support substrate 21 or the lateral surfaces of the semiconductor layer 22.

The first reflective material containing layer 40*a* is preferably disposed on the lower surfaces of the light emitting elements 20. That is, the first reflective material containing layer 40*a* is preferably also disposed on the lateral surfaces of the element electrodes 23 of the light emitting elements 20 and on the upper surface of the mounting board 10. The first reflective material containing layer 40*a* may be disposed on the mounting board 10 between the light emitting elements 20 and the frame 50. In the case in which the first reflective material containing layer 40*a* is disposed between the light emitting elements 20 and the frame 50, the light transmissive layer 40*b* with a very small thickness may be disposed on the first reflective material containing layer 40*a*.

The light transmissive layer 40*b* is formed between the light transmissive members 30. The light transmissive layer 40*b* preferably covers the lateral surfaces of the light transmissive members 30, such that the lateral surfaces thereof facing each other are covered from the light emitting elements 20 to a height of at least half of the lateral surfaces of the light transmissive members 30. This structure can enhance the light extraction efficiency between the light transmissive members 30 and can further enhance the light output efficacy of the light emitting device 100. The light transmissive layer 40*b* may cover portions of the lateral surfaces or an entirety of the lateral surfaces of the light transmissive members 30 between the light transmissive members 30. In particular, the light transmissive layer 40*b* preferably extends to the upper ends of opposing lateral surfaces of adjacent light transmissive members 30 between the light transmissive members 30. That is, the light transmissive layer 40*b* preferably covers an entirety of each lateral surface of the light transmissive members 30 between the light transmissive members 30.

The first reflective material containing layer 40*a* is formed by settling the first reflective material and is a region containing a high concentration of the first reflective material in the depth direction of the first cover member 40. The light transmissive layer 40*b* is a layer that is formed on the upper side and is mainly made of a resin formed by settling the first reflective material. In other words, there is no clear interface between the first reflective material containing layer 40*a* and the light transmissive layer 40*b*.

Examples of a resin material used for the first resin include thermosetting resins such as epoxy resins, modified epoxy resins, silicone resins, and modified silicone resins.

The viscosity of the first resin is preferably in a range of 0.3 Pa·s to 15 Pa·s at room temperature (20±5° C.). If the viscosity of the first resin is 0.3 Pa·s or more, the first resin is easily disposed on the upper surface of the mounting board 10 by potting. If the viscosity of the first resin is 15 Pa·s or less, the first cover member 40 is easily deformed using a centrifugal force. In addition, the first reflective material is easily settled using the centrifugal force. The viscosity of the first resin is more preferably in a range of 0.5 Pa·s to 6 Pa·s to provide the above effects.

The viscosity of the first resin here refers to the viscosity when the first reflective material is contained, in other words, the viscosity before the first reflective material contained in the first resin is settled using the centrifugal force as described later.

Examples of a light reflective material used as the first reflective material include titanium oxide, silica, silicon oxide, aluminum oxide, zirconium oxide, magnesium oxide, potassium titanate, zinc oxide, and boron nitride. Among these materials, titanium oxide, which has a comparatively high refractive index, is preferably used in view of reflection of light.

A substance having a higher specific gravity than the resin material used for the first resin is preferably used as the first reflective material. The difference in specific gravity between the first reflective material and the resin material facilitates settling of the first reflective material toward the upper surface of the mounting board 10 using the centrifugal force. In addition, employing a first reflective material with a large particle diameter allows the first reflective material to be settled more quickly toward the upper surface of the mounting board 10.

Use of the centrifugal force allows the first reflective material to be densely disposed and reduces the distances between particles, thereby reducing leakage and transmission of light to enhance the light reflectance of the first reflective material containing layer 40*a*.

The particle diameter of the first reflective material is preferably in a range of 0.1 μm to 1.0 μm. If the particle diameter of the first reflective material is 0.1 μm or more, the first reflective material is easily settled using the centrifugal force. If the particle diameter of the first reflective material is 1.0 μm or less, visible light is easily reflected. The particle diameter of the first reflective material is more preferably in a range of 0.4 μm to 0.6 μm in view of the above.

The frame 50 is disposed around the light emitting elements 20 on the mounting board 10. The frame 50 is made of a resin containing a reflective material and covers the upper surface of the mounting board 10. The frame 50 is formed into a substantially rectangular annular shape in a plan view.

The second cover member 60 is disposed around the light emitting elements 20 and contains the second reflective material. The second cover member 60 is made of a second resin containing the second reflective material and covers the upper surface of the mounting board 10. The second cover member 60 is disposed between the frame 50 and the light emitting elements 20. The second cover member 60 covers the lateral surfaces of the light emitting elements 20 and the lateral surfaces of the light transmissive members 30.

Examples of resin materials used for the resin of the frame 50 and the second resin include the above examples of the resin material used for the first resin. Examples of light reflective materials used for the reflective material of the frame 50 and the second reflective material include the above examples of the light reflective material used for the first reflective material.

Operation of Light Emitting Device

When the light emitting device 100 operates, an electric current is supplied from the external power supply to the light emitting elements 20 through the wiring 3, and the light emitting elements 20 emit light. Light emitted from the light emitting elements 20 and traveling upward is extracted to the outside on the upper side of the light emitting device 100 through the light transmissive members 30. Light traveling downward is reflected by the first reflective material containing layer 40*a* and extracted to the outside of the light emitting device 100 through the light transmissive members 30. Light traveling between the light emitting elements 20 and the frame 50 is reflected by the second cover member 60 and the frame 50, and extracted to the outside of the light emitting device 100 through the light transmissive members 30. Light traveling between the light emitting elements 20 is reflected by the first reflective material containing layer 40a and extracted to the outside of the light emitting device 100 through the light transmissive members 30. At this time, the light transmissive layer 40b is disposed between the light transmissive members 30, and the upper surfaces of the light transmissive members 30 and the light transmissive layer 40b between the light transmissive members 30 serve as the light emitting surface of the light emitting device 100. This structure enables light exiting from the lateral surfaces of the light transmissive members 30 between the light transmissive members 30 to be extracted to the outside through the light transmissive layer 40b, thereby enhancing the light extraction efficiency and the luminous efficacy of the light emitting device 100.

Method for Manufacturing Light Emitting Device 100

Next, an example of a method for manufacturing the light emitting device according to the embodiment will be described.

Figure 2:
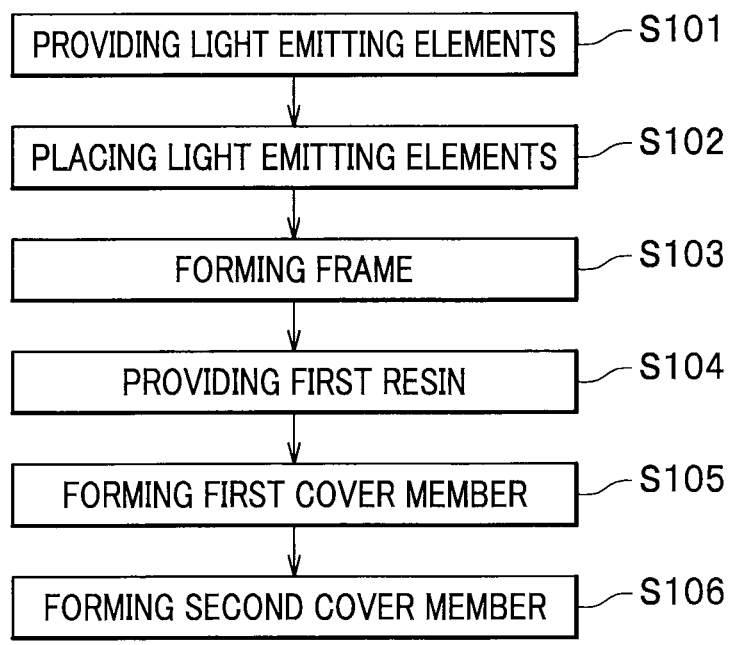
FIG. 2 is a flowchart illustrating a method for manufacturing the light emitting device according to the embodiment.
Figure 3A:
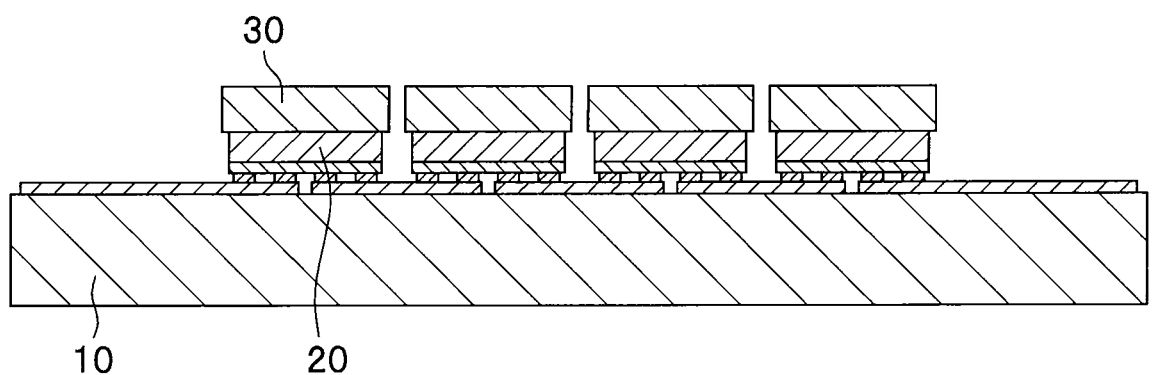
FIG. 3A is a schematic cross-sectional view illustrating a step of placing light emitting elements in the method for manufacturing the light emitting device according to the embodiment.
Figure 3B:
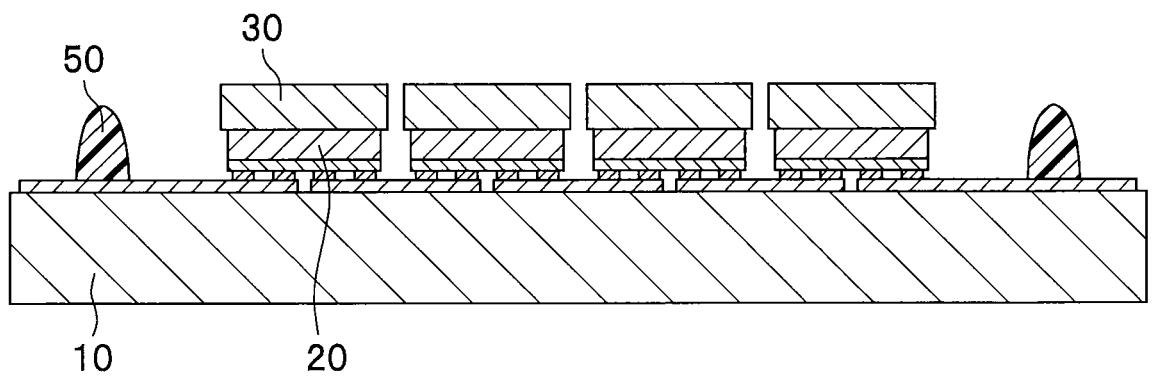
FIG. 3B is a schematic cross-sectional view illustrating a step of forming a frame in the method for manufacturing the light emitting device according to the embodiment.
Figure 3C:
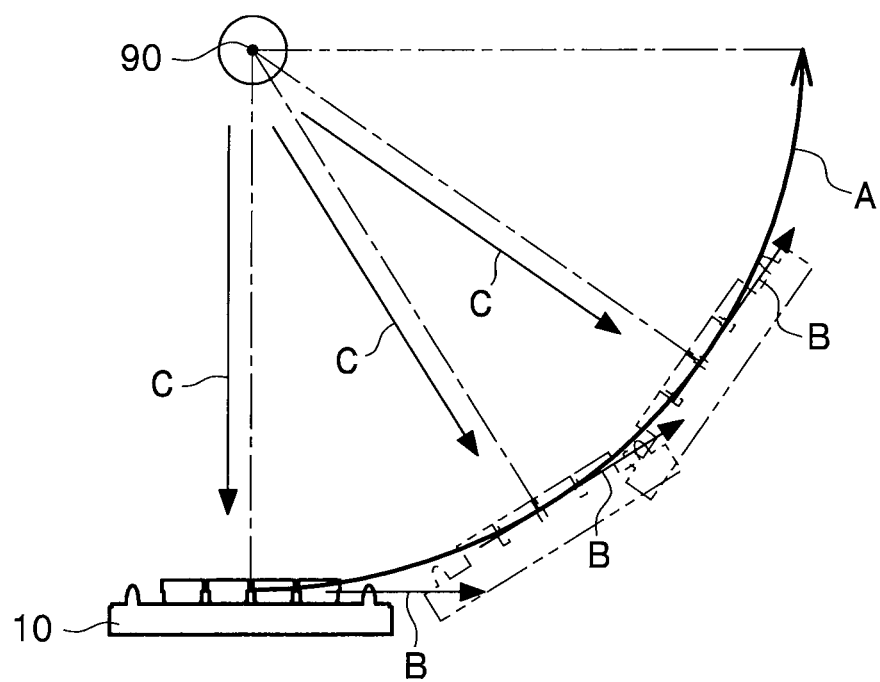
FIG. 3C is a schematic diagram showing a step of forming a first cover member in which the upper surface of a mounting board is covered with a first resin, the step of forming a first cover member including a step of settling a first reflective material using a centrifugal force in the method for manufacturing the light emitting device according to the embodiment.
Figure 3D:
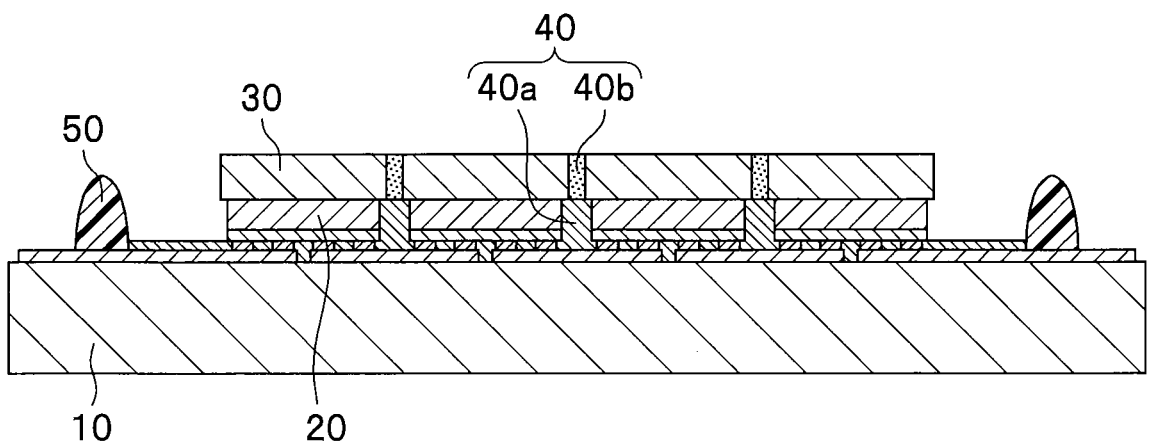
FIG. 3D is a schematic cross-sectional view after the first reflective material has been settled using the centrifugal force in the step of forming a first cover member in the method for manufacturing the light emitting device according to the embodiment.
Figure 3E:
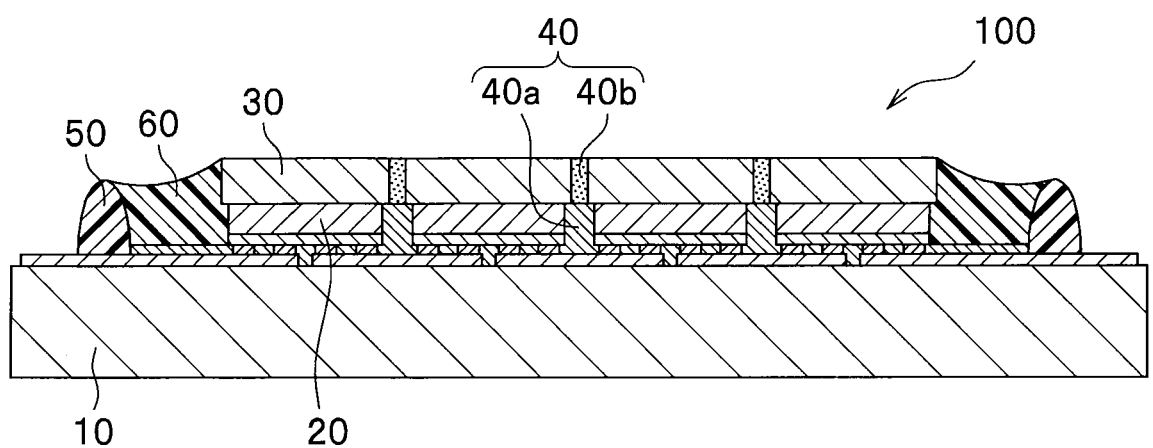
FIG. 3E is a schematic cross-sectional view illustrating a step of forming a second cover member in the method for manufacturing the light emitting device according to the embodiment.

FIG. 2 is a flowchart illustrating a method for manufacturing the light emitting device according to the embodiment. FIG. 3A is a schematic cross-sectional view illustrating a step of placing the light emitting elements in the method for manufacturing the light emitting device according to the embodiment. FIG. 3B is a schematic cross-sectional view illustrating a step of forming a frame in the method for manufacturing the light emitting device according to the embodiment. FIG. 3C is a schematic diagram showing a step of forming a first cover member in which the upper surface of a mounting board is covered with a first resin, the step of forming a first cover member including a step of settling a first reflective material using a centrifugal force in the method for manufacturing the light emitting device according to the embodiment. FIG. 3D is a schematic cross-sectional view after the first reflective material has been settled using the centrifugal force in the step of forming a first cover member in the method for manufacturing the light emitting device according to the embodiment. FIG. 3E is a schematic cross-sectional view illustrating a step of forming a second cover member in the method for manufacturing the light emitting device according to the embodiment.

The method for manufacturing the light emitting device 100 includes: Step S101 of providing light emitting elements, in which the light emitting elements 20, each having an upper surface on which a light transmissive member is disposed; Step S102 of placing the light emitting elements, in which the light emitting elements 20 are placed on or above the mounting board 10 with the light transmissive members 30 facing up; Step S103 of forming a frame, in which the frame 50 is formed around the light emitting elements 20; Step S104 of providing a first resin; Step S105 of forming a first cover member, in which the first cover member 40 is formed by covering the upper surface of the mounting board 10 with the first resin containing the first reflective material; and Step S106 of forming a second cover member, in which the second cover member 60 is formed by disposing the second resin containing the second reflective material around the light emitting elements 20. The step of forming the first cover member 40 includes forming the first reflective material containing layer 40a containing the first reflective material between the light emitting elements by settling the first reflective material contained in the first resin using a centrifugal force and forming the light transmissive layer 40b between the light transmissive members 30.

The material and arrangement of each member have been as described for the light emitting device 100, and their descriptions are omitted as appropriate.

Step of Providing Light Emitting Elements

In Step S101 of providing light emitting elements, the light emitting elements 20 provided with the light transmissive members 30 on their upper surfaces are provided.

In Step S101, for example, the light transmissive members 30 having a predetermined shape are bonded to the upper surfaces (i.e., the light extracting surfaces) of the light emitting elements 20. When the light transmissive members 30 are bonded to the light emitting elements 20, direct bonding or bonding with light guide members may be employed.

Step of Placing Light Emitting Elements

In Step S102 of placing the light emitting elements, the light emitting elements 20 are placed on or above the mounting board 10 such that the light transmissive members 30 are disposed on the upper side.

In Step S102, a plurality of light emitting elements 20 are placed on or above the upper surface of the mounting board 10. The light emitting elements 20 are flip-chip mounted on or above the upper surface of the mounting board 10 using an electrically conductive adhesive material with the surfaces provided with the electrodes being the mounting surfaces. Examples of the electrically conductive adhesive material include eutectic solder, electrically conductive paste, and bumps.

Step S101 of providing light emitting elements and Step S102 of placing the light emitting elements may not be clearly separated. For example, the light emitting elements 20 and the light transmissive members 30 may be bonded together after placing the light emitting elements 20 on or above the mounting board 10.

Step of Forming Frame

In Step S103 of forming a frame, the frame 50 is formed around the light emitting elements 20.

For example, the frame 50 can be formed at a desired position on the mounting board 10 using a discharging device (i.e., resin discharging device) that can continuously discharge a liquid resin by air pressure (see Japanese Patent Publication No. 2009-182307).

Step of Providing First Resin

In Step S104 of providing a first resin, a base component of a two-part curable resin material is mixed with the first reflective material, and a hardener is mixed after at least a certain period of time has passed.

Use of the first resin produced as described above enhances the compatibility between the first reflective material and the resin material, and facilitates settling of the first reflective material using the centrifugal force. The temperature before the hardener is mixed is about equal to room temperature.

Examples of the two-part curable resin material include silicone resins, modified silicone resins, epoxy resins, and modified epoxy resins.

The time allowed to elapse after mixing the base component of two-part curing-type resin material and the first reflecting material is preferably at least two hours from a perspective of further facilitating the settling of the first reflecting material. The time allowed to elapse is preferably eight hours at most from a manufacturing time reduction perspective. After the hardener is mixed, the subsequent step is started before the first resin is cured.

The concentration of the first reflective material in the uncured first resin is, for example, in a range of about 15 mass % to 60 mass %.

Step of Forming First Cover Member

In Step S105 of forming a first cover member, the upper surface of the mounting board 10 is covered with the first resin containing the first reflective material to form the first cover member 40.

In Step S105, for example, the uncured first resin is disposed on the upper surface of the mounting board 10 by potting. At this time, the first resin is disposed between the frame 50 and the light emitting elements 20 on or above the upper surface of the mounting board 10. The first resin spreads over the upper surface of the mounting board 10 and covers the upper surface of the mounting board 10 between adjacent light emitting elements 20.

Next, the mounting board 10 is subjected to centrifugal rotation in such a direction that the centrifugal force is applied to the upper surface of the mounting board 10. By this operation, the first resin moves toward the upper surface of the mounting board 10 to cover the upper surface of the mounting board 10. Forcibly settling the first reflective material in the first resin towards the upper surface of the mounting board 10 using the centrifugal force can form the first reflective material containing layer 40a containing a high concentration of the first reflecting material, as a first reflecting material settled layer, and a light transmissive layer 40b as a supernatant. By forming the first reflective material containing layer 40a by centrifugal settling as described above, the particles of the first reflective material can be densely disposed at the bottom surface while reducing the content of the first reflective material in the first resin.

The rotation of the mounting board 10 is preferably performed by applying the centrifugal force to the mounting board 10 about such a rotation axis 90 that the centrifugal force is applied to the upper surface of the mounting board 10 in the outward direction as shown in FIG. 3C. Specifically, the mounting board 10 is moved in a direction A that revolves around the rotation axis 90 at a positional relation that the upper surface of the mounting board 10 faces the rotational axis 90. A direction B in FIG. 3C is parallel to the upper surface of the mounting board 10. In FIG. 3C, three arrows indicating direction B are shown along the movement of the package 10, but the direction B actually continuous changes along with movement of the mounting board 10.

The rotational axis 90 is in parallel to and faces the upper surface of the mounting board 10 and is positioned on a line orthogonal to and passing through substantially the center of the upper surface of the mounting board 10. Accordingly, the centrifugal force is applied in the direction toward the upper surface of the mounting board 10 to reduce the spread of the first resin in the height direction of the mounting board 10, and to compulsorily settle the first reflective material contained in the first resin toward the upper surface (in the direction of an arrow C in FIG. 3C) of the mounting board 10.

Subsequently, when the rotation of the mounting board 10 is stopped, the first reflective material containing layer 40a remains between the light emitting elements 20, but the light transmissive layer 40b creeps up and spreads over the lateral surfaces facing each other between the light transmissive members 30 due to surface tension. In other words, the light transmissive layer 40b in the first resin is prevented from creeping up in the height direction during the rotation, but the light transmissive layer 40b is released from the centrifugal force when rotation is stopped to preferentially creep up the gaps between the light emitting elements 20 and between the light transmissive members 30 due to surface tension and to cover the lateral surfaces of the light transmissive members 30 facing each other. At this time, the first reflective material containing layer 40a remains on the lower side of the light transmissive layer 40b and covers the lateral surfaces of the light emitting elements 20 because the specific gravity of the first reflective material containing layer 40a containing a high concentration of the first reflective material is higher than the specific gravity of the light transmissive layer 40b containing substantially no first reflective material. The first resin is cured in this state. Accordingly, the first reflective material containing layer 40a containing the first reflective material is formed between the light emitting elements 20, and the light transmissive layer 40b is formed between the light transmissive members 30. The light transmissive layer 40b is very thin or hardly formed between the light emitting elements 20 and the frame 50.

Subsequently, the first resin is cured to form the first cover member 40. The first resin is preferably cured after the rotation is stopped.

The temperature during the curing of the first resin is, for example, 40° C. to 200° C. Increasing the temperature during the curing can reduce the curing time of the first resin and can enhance efficiency.

The amount of the first cover member 40 to be applied and the content of the first reflective material in the first resin are appropriately adjusted.

The speed of rotation and the number of revolutions in the centrifugal rotation of the mounting board 10 depend on the content and particle diameter of the first reflective material, and the number of revolutions and the radius of gyration may be adjusted such that, for example, a centrifugal force of 200×g or more is applied.

When mounting boards 10 are subjected to centrifugal rotation in the state of a collective board before being singulated in the manufacturing process, if the collective board is a flat plate, the larger the plane area of the collective board is (more specifically, the greater the length of the mounting board in the direction A of rotation is), the larger the deviations of mounting boards 10 located away from the center of the collective board from the rotation axis 90 are. For example, in the collective board, a large deviation in direction B from the rotation circumference would cause the first resin surface to be inclined to the upper surface of the mounting board 10, possibly resulting in variation in the surface state of the first resin among the packages in the substrate block. The variations can be reduced by increasing the radius of gyration. Specifically, the variations of the surface state due to the deviations can be reduced by employing a radius of gyration that is 70 times or more as large as the length of the collective board disposed in the direction of rotation.

In the case of using resin mounting board 10 having flexibility where the collective board flexes along the rotation circumference of the gyration radius by the centrifugal force, the resin mounting board 10 would be less susceptible to the deviations described above. Thus, rotation can be performed with a larger collective board than in the case of employing a collective board composed of non-flexible mounting boards 10 under the same centrifugal force. This can increase the number of mounting boards to be treated at a time. Examples of the flexible collective board include resin mounting boards connected by leads.

Step of Forming Second Cover Member

In Step S106 of forming a second cover member, the second resin containing the second reflective material is disposed around the light emitting elements 20 to form the second cover member 60.

In Step S106, the second resin is disposed between the frame 50 and the light emitting elements 20 by, for example, potting or spraying. After that, for example, the second resin is cured at a temperature of 120° C. to 200° C. to form the second cover member 60.

The light emitting device and the method for manufacturing the light emitting device have been described above on the basis of certain embodiments of the present invention, but the scope of the present invention is not limited by these descriptions, but rather should be broadly interpreted on the basis of the claims. The scope of the present invention also encompasses various modifications based on these descriptions.

ANOTHER EMBODIMENT

Figure 4A:
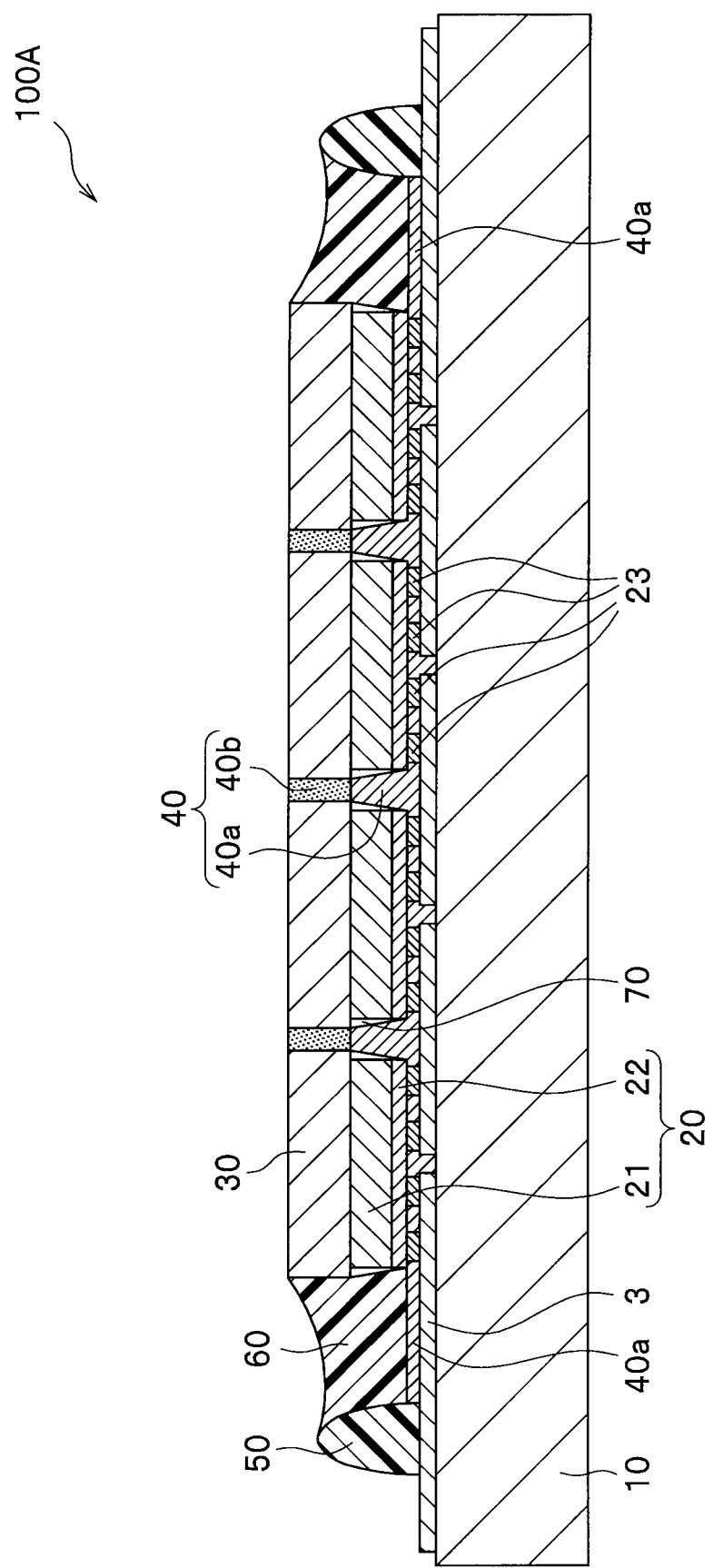
FIG. 4A is a schematic cross-sectional view illustrating the structure of a light emitting device according to another embodiment.
Figure 4B:
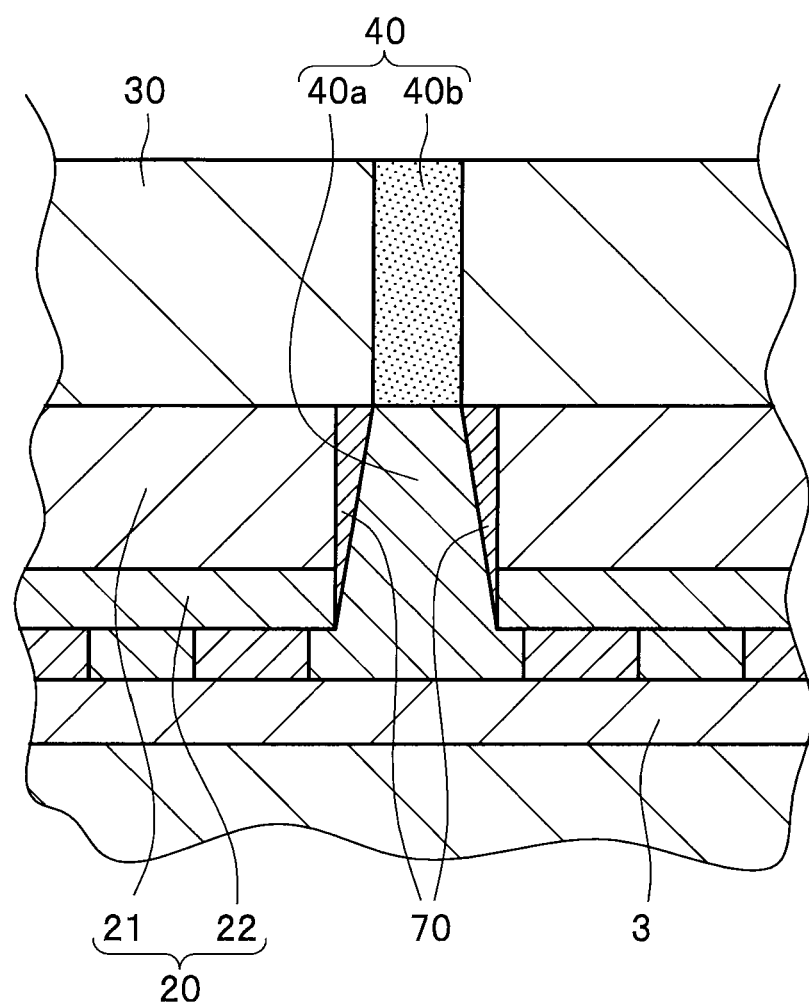
FIG. 4B is a schematic cross-sectional view illustrating a portion of the structure of the light emitting device according to the other embodiment.

FIG. 4A is a schematic cross-sectional view illustrating the structure of a light emitting device according to another embodiment. FIG. 4B is a schematic cross-sectional view illustrating a portion of the structure of the light emitting device according to the other embodiment.

A light emitting device 100A shown in FIG. 4A and FIG. 4B further includes light guide members 70 that cover the lateral surfaces of the light emitting elements 20.

The light guide members 70 facilitate extraction of light from the light emitting elements 20 and guide light emitted from the light emitting elements 20 to the light transmissive members 30. The light emitting device 100A includes the light guide members 70, and therefore has improved luminous flux and light extraction efficiency.

For example, a light transmissive resin material can be used for the light guide members 70. Examples of the resin material used for the light guide members 70 include the above examples of the resin material used for the resin for the light transmissive members 30.

The light guide members 70 may contain a diffusing agent such as silica, titanium oxide, silicon oxide, aluminum oxide, potassium titanate, zinc oxide, and boron nitride. Light can thus more evenly enter the light transmissive members 30, so that the color unevenness of the light emitting device 100A can be reduced.

The light guide members 70 may be each formed into a substantially triangular shape that broadens from the lower surface (i.e., a side close to element electrodes 23) of the light emitting element 20 toward the light transmissive member 30 in a cross-sectional view. This configuration may further enhance the luminous flux and the light extraction efficiency. The light guide member 70 is not limited to particular shapes. For example, the shape of the light guide member 70 may be concave outward or concave inward (toward the light emitting element 20).

The light guide member 70 may cover a portion of the lateral surfaces of the light emitting element 20, but preferably covers substantially an entirety of the lateral surfaces of the light emitting element 20 to enhance the above effects. The light guide member 70 may be disposed between the light transmissive member 30 and the light emitting element 20.

The light guide member 70 can be formed in Step S101 of providing light emitting elements. That is, in a method for manufacturing the light emitting device 100A, Step S101 of providing the light emitting elements includes bonding the light transmissive member 30 to the lower surface of the light emitting element 20 and forming the light guide member 70 on the lateral surfaces of the light emitting element 20.

In the step of forming the light guide member 70 on the lateral surfaces of the light emitting element 20 in Step S101, a resin intended to cover the lateral surfaces of the light emitting element 20 is disposed by, for example, potting. The disposition of resin on the lateral surfaces of the light emitting element 20 bonded to the light transmissive member 30 can be performed by discharging the uncured resin material with the light emitting element 20 facing up from a nozzle of a tip of a resin discharging device filled with the resin onto the vicinities of the lateral surfaces of the light emitting element 20 on the upper surface (i.e., a surface close to the light emitting element 20) of the light transmissive member 30 (preferably onto the boundaries between the upper surface of the light transmissive member 30 and the lateral surfaces of the light emitting element 20). The uncured resin spreads over the lateral surfaces of the light emitting element 20 and covers the lateral surfaces of the light emitting element 20. The viscosity and position of the resin to be formed are preferably adjusted such that the resin creeps up to the upper portions of the lateral surfaces of the light emitting element 20. In the case in which the light guide member 70 is formed by potting, the viscosity of the resin is, for example, in a range of 1 Pa·s to 50 Pa·s at room temperature (20±5° C.).

After that, for example, the resin is cured at a temperature in a range of 120° C. to 200° C. to form the light guide member 70. It is preferable that the resin be cured with the mounting board 10 standing still after the resin has spread over the lateral surfaces of the light emitting element 20.

That is, in the case in which the light guide member 70 is also disposed between the light transmissive member 30 and the light emitting element 20, the step of bonding the light transmissive member 30 to the upper surface of the light emitting element 20 and the step of forming the light guide member 70 on the lateral surfaces of the light emitting element 20 can be performed at the same time.

The light emitting device described above includes the frame and the second cover member, but these members may be omitted.

The method for manufacturing the light emitting device may include another step between steps or before or after any of the steps as long as the additional step does not adversely affect the other steps. For example, a foreign matter removal step of removing foreign matters mixed during manufacture may be included.

In the method for manufacturing the light emitting device, the order of some steps is not limited but may be changed. For example, the method for manufacturing the light emitting device described above includes the step of providing a first resin after the step of forming a frame, but the step of providing a first resin may be performed before the step of forming a frame or before the step of placing the light emitting elements. The step of providing a first resin may be omitted.

The step of forming a frame is performed after the step of placing the light emitting elements and before the step of providing a first resin in the above embodiments, but may be performed after the step of providing a first resin and before the step of forming a first cover member, or may be performed before the step of forming a second cover member. The step of forming a frame may be performed before the step of placing the light emitting elements.

The light emitting devices according to the embodiments of the present disclosure can be used for light sources for backlights of liquid-crystal displays, a variety of lighting apparatuses, large format displays, and various displays for advertisements or destination guide, as well as digital video cameras, image scanners in apparatuses such as facsimile machines, copying machines, and scanners, projectors, and other apparatuses.

The invention claimed is:

1. A method for manufacturing a light emitting device, comprising:
   providing a plurality of light emitting elements, each having an upper surface on which a light transmissive member is disposed;
   placing the light emitting elements on or above a mounting board with the light transmissive members facing up;
   forming a first cover member, which comprises steps of:
      covering an upper surface of the mounting board with a first resin containing a first reflective material, and
      settling the first reflective material in the first resin using a centrifugal force so as to form a first reflective material containing layer containing the first reflective material between the light emitting elements, and so as to form a light transmissive layer between the light transmissive members; and
   after the step of forming the first cover member, forming a second cover member, which comprises a step of disposing a second resin containing a second reflective material around the light emitting elements.

2. The method for manufacturing a light emitting device according to claim 1, wherein the step of providing a plurality of light emitting elements comprises:
   bonding the light transmissive members to the upper surfaces of the light emitting elements, and
   forming at least one light guide member on at least one of lateral surfaces of at least one of the light emitting elements.

3. The method for manufacturing a light emitting device according to claim 1, wherein a viscosity of the first resin is in a range of 0.3 Pa·s to 15 Pa·s.

4. The method for manufacturing a light emitting device according to claim 1, further comprising:
   before the step of forming the first cover member, providing the first resin, which comprises a step of mixing a base component of a two-part curable resin material with the first reflective material and mixing a hardener at least two hours later.

5. The method for manufacturing a light emitting device according to claim 1, wherein the light transmissive members comprise a wavelength conversion material.

6. A method for manufacturing a light emitting device, comprising:
   providing a plurality of light emitting elements, each having an upper surface on which a light transmissive member is disposed;
   placing the light emitting elements on or above a mounting board with the light transmissive members facing up;
   after the step of placing the light emitting elements on or above a mounting board, forming a frame around the light emitting elements;
   forming a first cover member, which comprises steps of:
      covering an upper surface of the mounting board with a first resin containing a first reflective material, and
      settling the first reflective material in the first resin using a centrifugal force so as to form a first reflective material containing layer containing the first reflective material between the light emitting elements, and so as to form a light transmissive layer between the light transmissive members; and
   after the steps of forming the frame around the light emitting elements and forming the first cover member, forming a second cover member, which comprises a step of disposing a second resin containing a second reflective material around the light emitting elements.

7. The method for manufacturing a light emitting device according to claim 6, wherein the step of providing a plurality of light emitting elements comprises:
   bonding the light transmissive members to the upper surfaces of the light emitting elements, and
   forming at least one light guide member on at least one of lateral surfaces of at least one of the light emitting elements.

8. The method for manufacturing a light emitting device according to claim 6, wherein a viscosity of the first resin is in a range of 0.3 Pa·s to 15 Pa·s.

9. The method for manufacturing a light emitting device according to claim 6, further comprising:
   before the step of forming the first cover member, providing the first resin, which comprises a step of mixing a base component of a two-part curable resin material with the first reflective material and mixing a hardener at least two hours later.

10. The method for manufacturing a light emitting device according to claim 6, wherein the light transmissive members comprise a wavelength conversion material.

11. A method for manufacturing a light emitting device, comprising:
   providing a plurality of light emitting elements, each having an upper surface on which a light transmissive member is disposed;
   placing the light emitting elements on or above a mounting board with the light transmissive members facing up;
   providing a first resin, which comprises a step of mixing a base component of a two-part curable resin material with a first reflective material and mixing a hardener at least two hours later; and
   after the step of mixing the base component, forming a first cover member, which comprises steps of:
      covering an upper surface of the mounting board with the first resin containing the first reflective material, and
      settling the first reflective material in the first resin using a centrifugal force so as to form a first reflective material containing layer containing the first reflective material between the light emitting elements, and so as to form a light transmissive layer between the light transmissive members.

12. The method for manufacturing a light emitting device according to claim 11, wherein the step of providing a plurality of light emitting elements comprises:
   bonding the light transmissive members to the upper surfaces of the light emitting elements, and
   forming at least one light guide member on at least one of lateral surfaces of at least one of the light emitting elements.

13. The method for manufacturing a light emitting device according to claim 11, wherein a viscosity of the first resin is in a range of 0.3 Pa·s to 15 Pa·s.

14. The method for manufacturing a light emitting device according to claim 11, wherein the light transmissive members comprise a wavelength conversion material.

\* \* \* \* \*